United States Patent
Suzuki et al.

(10) Patent No.: US 8,257,499 B2
(45) Date of Patent: Sep. 4, 2012

(54) VAPOR PHASE DEPOSITION APPARATUS AND VAPOR PHASE DEPOSITION METHOD

(75) Inventors: Kunihiko Suzuki, Shizuoka (JP); Hideki Arai, Shizuoka (JP); Hironobu Hirata, Shizuoka (JP)

(73) Assignee: NuFlare Technology, Inc., Shizuoka (JP)

(*) Notice: Subject to any disclaimer, the term of this patent is extended or adjusted under 35 U.S.C. 154(b) by 482 days.

(21) Appl. No.: 12/030,058

(22) Filed: Feb. 12, 2008

(65) Prior Publication Data

US 2008/0193646 A1 Aug. 14, 2008

(30) Foreign Application Priority Data

Feb. 13, 2007 (JP) ................. 2007-031512

(51) Int. Cl.
*C23C 16/455* (2006.01)
*C23C 16/458* (2006.01)
*C23F 1/00* (2006.01)
*H01L 21/306* (2006.01)
*C23C 16/06* (2006.01)
*C23C 16/22* (2006.01)

(52) U.S. Cl. .............. 118/730; 156/345.55; 156/345.51; 156/345.54; 118/715

(58) Field of Classification Search .......... 118/730, 118/715; 156/345.55, 345.51, 345.54
See application file for complete search history.

(56) References Cited

U.S. PATENT DOCUMENTS

| | | | | |
|---|---|---|---|---|
| 5,332,462 A * | 7/1994 | Myers | ............ | 156/353 |
| 5,695,316 A * | 12/1997 | Schutz et al. | .......... | 415/90 |
| 5,788,747 A * | 8/1998 | Horiuchi et al. | ........ | 95/288 |
| 5,891,350 A * | 4/1999 | Shan et al. | .......... | 216/71 |
| 6,156,151 A * | 12/2000 | Komino et al. | ........ | 156/345.29 |
| 6,206,976 B1 * | 3/2001 | Crevasse et al. | ........ | 118/720 |
| 6,261,408 B1 * | 7/2001 | Schneider et al. | ....... | 156/345.26 |
| 6,373,159 B1 * | 4/2002 | Shinozaki | ............ | 310/90.5 |
| 6,382,249 B1 * | 5/2002 | Kawasaki et al. | ......... | 137/565.3 |
| 6,499,973 B2 * | 12/2002 | Maejima | ................ | 417/423.4 |
| 6,514,348 B2 * | 2/2003 | Miyamoto | ............ | 118/715 |
| 6,896,764 B2 * | 5/2005 | Kitazawa | ............ | 156/345.29 |
| 7,749,326 B2 * | 7/2010 | Kim et al. | ............ | 118/715 |
| 8,142,567 B2 * | 3/2012 | Kobayashi et al. | ........ | 118/715 |
| 2004/0082251 A1 * | 4/2004 | Bach et al. | ............ | 445/60 |
| 2006/0169673 A1 * | 8/2006 | Okumura et al. | ......... | 216/67 |
| 2008/0066859 A1 * | 3/2008 | Kobayashi et al. | ....... | 156/345.1 |
| 2010/0192857 A1 * | 8/2010 | Kobayashi et al. | ....... | 118/723 R |
| 2011/0070141 A1 * | 3/2011 | Sneh | ............ | 423/325 |

FOREIGN PATENT DOCUMENTS

JP 63136523 A * 6/1988

(Continued)

OTHER PUBLICATIONS

English Abstract of JP-05-152207A.

(Continued)

*Primary Examiner* — Rudy Zervigon

(74) *Attorney, Agent, or Firm* — DLA Piper LLP (US)

(57) ABSTRACT

A vapor phase deposition apparatus includes: a chamber, a supply unit configured to supply a raw gas into the chamber, a support table disposed in the chamber and configured to support a substrate in the chamber, a rotatable bladed wheel configured to have a plurality of blades, to be arranged to surround the support table, and to discharge the raw gas from above the substrate, and a exhaust unit configured to exhaust the raw gas discharged by the bladed wheel after a vapor phase deposition reaction from the chamber.

8 Claims, 9 Drawing Sheets

FOREIGN PATENT DOCUMENTS

| | | |
|---|---|---|
| JP | 05-152207 A | 6/1993 |
| JP | 2005-285939 A | 10/2005 |
| JP | 2006-100741 | 4/2006 |
| JP | 2006-222229 A | 8/2006 |

OTHER PUBLICATIONS

English Abstract of JP-2006-222229A.
English Abstract of JP 2005-285939A.
Applicants' comments on listed foreign patent documents.
Japanese Office Action dated Aug. 16, 2011 issued in JP 2007-031512.
English Language Translation of Japanese Office Action dated Aug. 16, 2011 issued in JP 2007-031512.
English Language Abstract of JP 2006-100741 published on Apr. 13, 2006.
English Language Translation of JP 2006-100741 published on Apr. 13, 2006.

* cited by examiner

Related Art

VAPOR PHASE DEPOSITION APPARATUS AND VAPOR PHASE DEPOSITION METHOD

CROSS-REFERENCE TO RELATED APPLICATION

This application is based upon and claims the benefit of priority from prior Japanese Patent Application No. 2007-031512 filed on Feb. 13, 2007 in Japan, the entire contents of which are incorporated herein by reference.

BACKGROUND OF THE INVENTION

1. Field of the invention

The present invention relates to vapor phase deposition apparatus and a vapor phase deposition method. For example, a mechanism which condition a flow of a raw gas containing a silicon source used in the manufacturing of a wafer in an epitaxial growth apparatus.

2. Related art

In the manufacturing of a semiconductor device such as an ultrahigh-speed bipolar transistor or an ultrahigh-speed CMOS, an epitaxial growth technique for a monocrystal in which an impurity concentration and a film thickness are controlled is indispensable to improvement of performance of a semiconductor device.

In epitaxial growth which refines a monocrystal thin film on a wafer or the like, an atmospheric-pressure chemical vapor deposition method is generally used. Depending on circumstances, a low-pressure chemical vapor deposition (LPCVD) method is used. A wafer is set in a vapor phase deposition reaction furnace. A state in the vapor phase deposition reaction furnace is kept at an atmospheric pressure (0.1 Mpa (760 Torr)) or a vacuum atmosphere of a predetermined degree of vacuum, and a raw gas obtained by mixing a silicon source and a dopant such as a boron compound, an arsenic compound, or a phosphorous compound is supplied into the furnace while the wafer is heated and rotated. A thermal decomposition or a hydrogen reduction reaction of the raw gas is performed on a surface of the heated wafer to grow a vapor phase deposition film doped with boron (B), phosphorous (P), or arsenic (As), thereby manufacturing a epitaxial wafer.

The epitaxial growth technique is also used in the manufacturing, for example, an IGBT (Insulate Gate Bipolar Transistor). In order to manufacture a high-performance semiconductor device, a high-quality crystal film is required to be uniformly and thickly grown. For example, only a film thickness of several micromillimeters or less is necessary in a simple MOS device or the like. However, in an IGBT or the like, a film thickness of several micromillimeters to one hundred and several score micromillimeters is necessary. For this reason, the wafer is rotated at a high speed, and a raw gas is caused to flow onto a wafer surface heated to a vapor phase deposition temperature. A newly supplied raw gas is sequentially brought into contact with wafer surfaces to grow vapor phase deposition films on the wafer surfaces. In this manner, a growth rate of the vapor phase deposition film is advanced.

FIG. 9 is a conceptual diagram showing a configuration of a conventional vapor phase deposition apparatus 400.

When conventional vapor phase deposition is performed, a wafer 401 is held on a holder 404 (also called a susceptor). The wafer 401 is rotated at a high speed with the holder 404 rotated at a high speed. The wafer 401 is heated by using an inner heater 405 and an outer heater 406. A raw gas is supplied from a supply passage 407 connected to a chamber 402. The raw gas is thermally decomposed or hydrogen-reduction on the wafer 401 to grow a vapor phase deposition film.

In this case, concerning a technique to grow a vapor phase deposition film with a uniform film thickness distribution, a technique of performing vapor phase deposition while rotating a wafer at a high speed is disclosed (for example, see Published Unexamined Japanese Patent Application Publication No. 5-152207(JP-A-05-152207)).

However, even though a center of gravity of the placed wafer 401 is slightly out of a center of rotation of the holder 404, the wafer 401 disadvantageously gets out of the holder 404 in response to centrifugal force or the like generated by high-speed rotation of the holder 404. In the worst case, both the vapor-deposition deposition apparatus 400 and the wafer 401 may be broken by the blown-off wafer 401.

BRIEF SUMMARY OF THE INVENTION

It is an object of the present invention to provide a vapor phase deposition apparatus and a vapor phase deposition method which can increase a growth rate of a vapor phase deposition film without rotating a wafer at a high speed.

A vapor phase deposition apparatus according to an embodiment of the present invention includes a chamber, a supply unit configured to supply a raw gas into the chamber, a support table disposed in the chamber and configured to support a substrate in the chamber, a rotatable bladed wheel configured to have a plurality of blades, to be arranged to surround the support table, and to discharge the raw gas from above the substrate, and a exhaust unit configured to exhaust the raw gas discharged by the bladed wheel after a vapor phase deposition reaction from the chamber.

A vapor phase deposition method according to an embodiment of the present invention includes rotating a bladed wheel which is arranged to surround a support table for support a substrate in a chamber and has a plurality of blades, and supplying a raw gas toward the substrate supported by the support table while rotating the bladed wheel to perform vapor phase deposition.

DETAILED DESCRIPTION OF THE INVENTION

In embodiments, as an example of vapor phase deposition, a configuration of an apparatus which performs epitaxial growth will be described below.

First Embodiment

Figure 1:
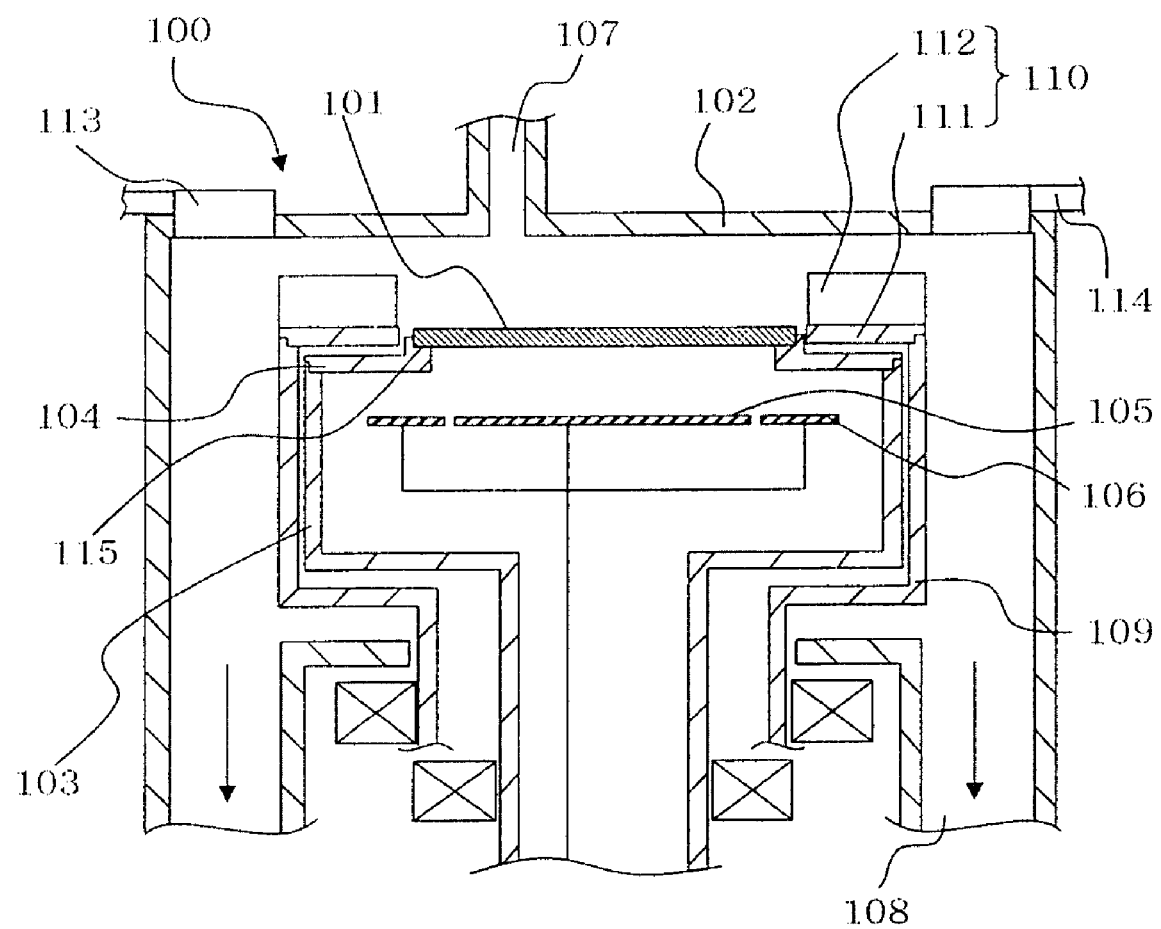
FIG. 1 is a conceptual diagram showing an epitaxial growth apparatus according to a first embodiment of the present invention.

FIG. 1 is a conceptual diagram showing an epitaxial growth apparatus according to a first embodiment.

In an epitaxial growth apparatus 100 in FIG. 1, a chamber 102 in which a wafer 101 (example of a substrate) is set is arranged. In the chamber 102, a holder 104, an inner heater 105, an outer heater 106, and a bladed wheel 110 are arranged. The holder 104 is an example of a support table to support the wafer 101.

A supply passage 107 for a raw gas supplied to perform epitaxial growth is located on the upper portion of the chamber 102. The supply passage 107 is an example of a supply unit. Furthermore, a exhaust passage 108 which exhausts the raw gas out of the chamber 102 after an epitaxial growth process is located on the lower portion of the chamber 102. The exhaust passage 108 is an example of a exhaust unit.

The raw gas is supplied from the supply passage 107 toward the wafer 101 in the chamber 102 and thermally decomposed or hydrogen-reduction on the heated wafer 101 to grow an epitaxial growth film. The raw gas used in the epitaxial growth is exhausted out of the chamber 102 through the exhaust passage 108.

In FIG. 1, constituent elements necessary to explain the first embodiment are described, reduced scales or the like of the members constituting the epitaxial growth apparatus are not conformed to those of a real epitaxial growth apparatus. The same applies to the respective drawings.

Two sets of heaters to heat the wafer 101 are arranged under the wafer 101.

The inner heater 105 is arranged under a central portion of the wafer 101 to heat the central portion of the wafer 101. The outer heater 106 is arranged under the outer circumferential portion of the wafer 101 to simultaneously heat the outer circumferential portion of the wafer 101 and the inner end portion of the holder 104. The outer circumferential portion of the wafer 101 easily decreases in temperature because the outer circumferential portion is in contact with the holder 104. For this reason, both the wafer 101 and the holder 104 are heated to prevent heat from escaping from the outer circumferential portion of the wafer 101, so as to make it easy to perform control to make a temperature distribution on the whole surface of the wafer 101 uniform.

In the holder 104, a recessed portion 115 having a depth which is smaller than the thickness of the wafer 101 and an inner diameter which is slightly larger than the diameter of the wafer 101 is formed. The wafer 101 is placed to be fitted in the recessed portion 115.

In the chamber 102, a rotatable bladed wheel 110 is arranged to surround the holder 104. The bladed wheel 110 has a circular base plate 111, and a plurality of blades 112 arranged on the base plate 111.

The holder 104 is connected to a holder rotating member 103. Similarly, the bladed wheel 110 is connected to a wheel rotating member 109. The holder rotating member 103 rotates. The wheel rotating member 109 rotates. For this reason, the holder 104 and the bladed wheel 110 can be rotated such that a common center of the holder 104 and the bladed wheel 110 which are perpendicular to the wafer 101 plane is used as an axis. Therefore, the wafer 101 held on the holder 104 and the blades 112 fixed to the base plate 111 of the bladed wheel 110 can be rotated in a predetermined direction.

A shower plate 113 is arranged above the exhaust passage 108 to exhaust the raw gas out of the chamber 102. From the shower plate 113, a pressure gas blowing toward the exhaust passage 108 is blown. A pressure gas pipe 114 which supplies the pressure gas is connected to the shower plate 113.

An epitaxial growth method according to the first embodiment will be described below.

Figure 2:
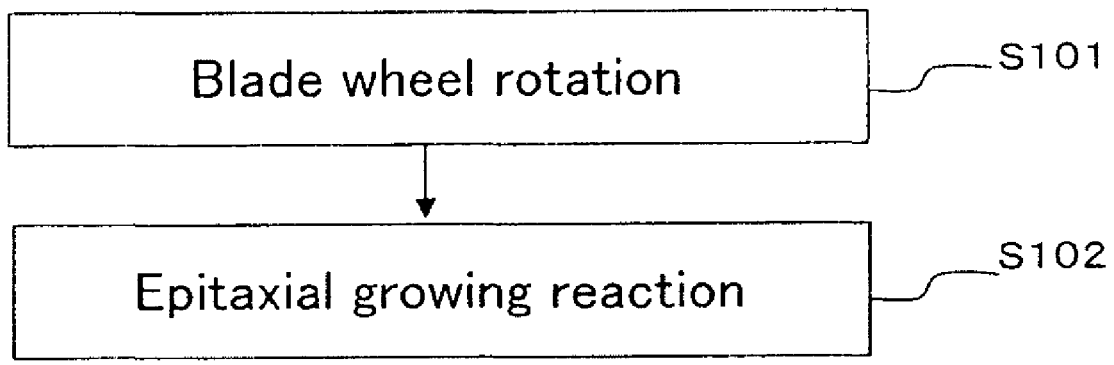
FIG. 2 is a flow chart showing a procedure of an epitaxial growth method according to the first embodiment.

FIG. 2 is a flow chart showing a procedure of the epitaxial growth method according to the first embodiment.

In the epitaxial growth method according to the embodiment, the wafer 101 is set in the chamber 102 which is kept at an atmospheric pressure or a predetermined degree of vacuum. The wafer 101 is held on the holder 104. The wafer 101 is heated by the inner heater 105 and the outer heater 106 such that a temperature distribution in the wafer 101 plane is uniformed at a predetermined temperature.

As a bladed wheel rotating step (S101), the bladed wheel 110 is rotated. While the rotation of the bladed wheel 110 is continued, a raw gas is supplied from the supply passage 107 toward the heated wafer 101. As an epitaxial growth step (S102), a thermal decomposition reduction or a hydrogen-reduction reaction is performed on the wafer 101 surface to cause epitaxial growth.

Figure 3:
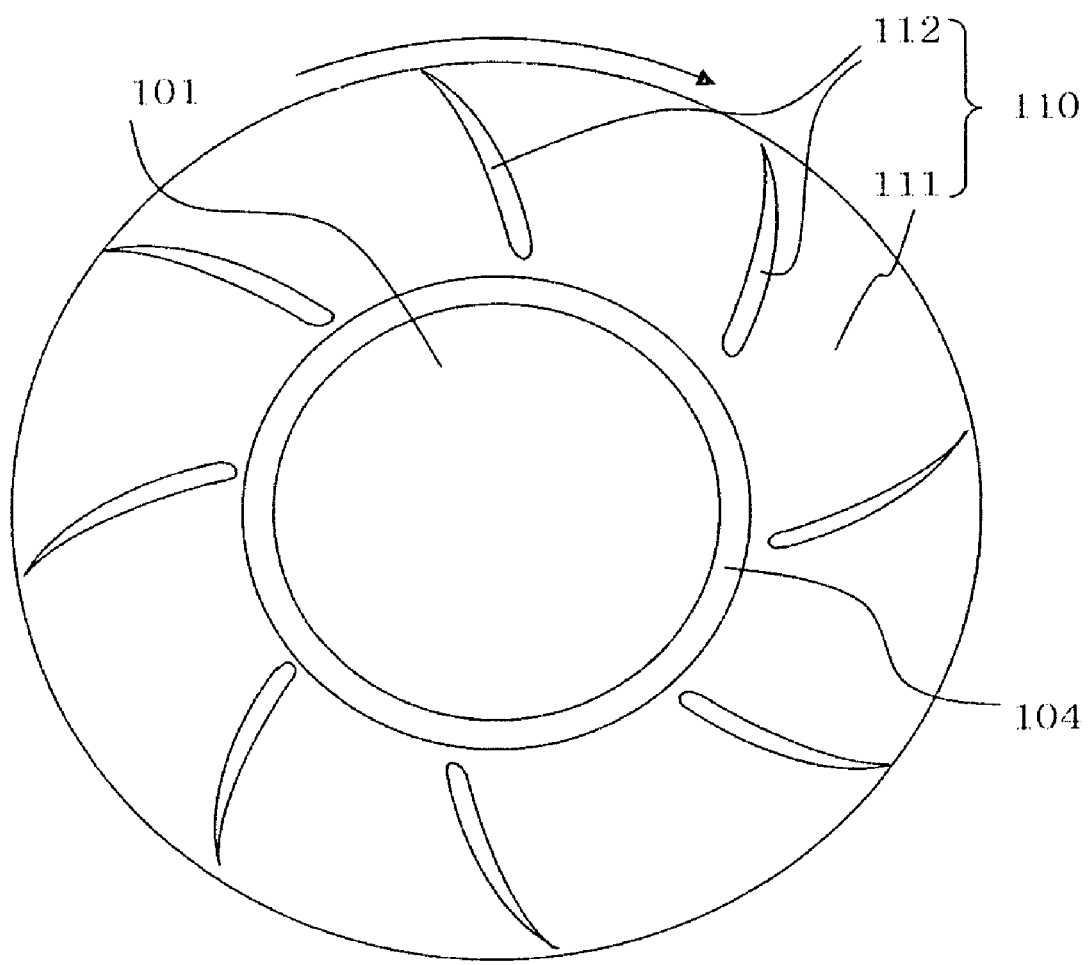
FIG. 3 is a conceptual diagram showing a wafer and a bladed wheel according to the first embodiment of the present invention when viewed from the top.

FIG. 3 is a conceptual diagram of the wafer 101 and the bladed wheel 110 according to the first embodiment when viewed from the top.

As shown in FIG. 3, the blades 112 are fixed on the circular base plate 111 of the bladed wheel 110 at substantial equal distances. Each of the blades 112 are arranged at a predetermined angle with respect to a radial direction of the circular base plate 111 of the bladed wheel 110. For this reason, when the bladed wheel 110 rotates at a high speed in a direction of an arrow in FIG. 2, the raw gas above the wafer 101 is almost horizontally discharged to the outside. More specifically, in the embodiment, the raw gas obtained after the epitaxial growth is quickly discharged from the upper side of the wafer 101 by the rotation of the bladed wheel 110. In this manner, a laminar flow of the raw gas is formed on the wafer 101, and a new raw gas is smoothly supplied from the supply passage 107.

At this time, when the bladed wheel 110 is rotated at a rotation speed of, for example, 500 min$^{-1}$ (rpm) or more, the function above described is brought out. In this manner, a state in which the laminar flow of the raw gas is formed on the wafer 101 can be maintained.

At this time, the holder 104 is rotated at a rotation speed of, for example, about 0 to 50 min$^{-1}$. More specifically, the holder 104 may be slowly rotated, or the holder 104 may be substantially stopped.

In a conventional epitaxial growth apparatus, a pump effect achieved by rotating the holder and the wafer at a high speed is expected. The pump effect mentioned here is that the raw gas is caused to flow from above the wafer to the outside by rotating the wafer at a high speed so as to prevent sequentially supplied raw gas from being accumulated on the wafer.

In the embodiment, the function is brought out by the rotation of the bladed wheel 110 for this reason, the holder 104 need not be rotated at a high speed. Therefore, the holder 104 can be slowly rotated or stopped to make it easy to stably hold the wafer 101. As a result, unnecessary force such as centrifugal force does not influence on the wafer 101. For this reason, the risk of getting the wafer 101 out of the holder 104 and damaging the wafer 101 can be reduced.

As described above, the epitaxial growth is performed while rotating the bladed wheel 110, so that a growth rate of the epitaxial growth film grown on the wafer 101 and uniformity of the film thickness can be safely advanced.

At this time, the raw gas is composed by adding a predetermined dopant gas to a gas mixture of one of silane ($SiH_4$), dichlorosilane ($SiH_2Cl_2$), trichlorosilane ($SiHCl_3$), and the like serving as a silicone film-forming gas and hydrogen ($H_2$) serving as a carrier gas.

As the dopant gas, boron-based diborane ($B_2H_6$) phosphorous-based phosphine ($PH_3$), or the like is known. An epitaxial growth film of a p-type conductivity is grown by adding diborane, and an epitaxial growth film of an n-type conductivity is grown by adding phosphine.

Figure 4:
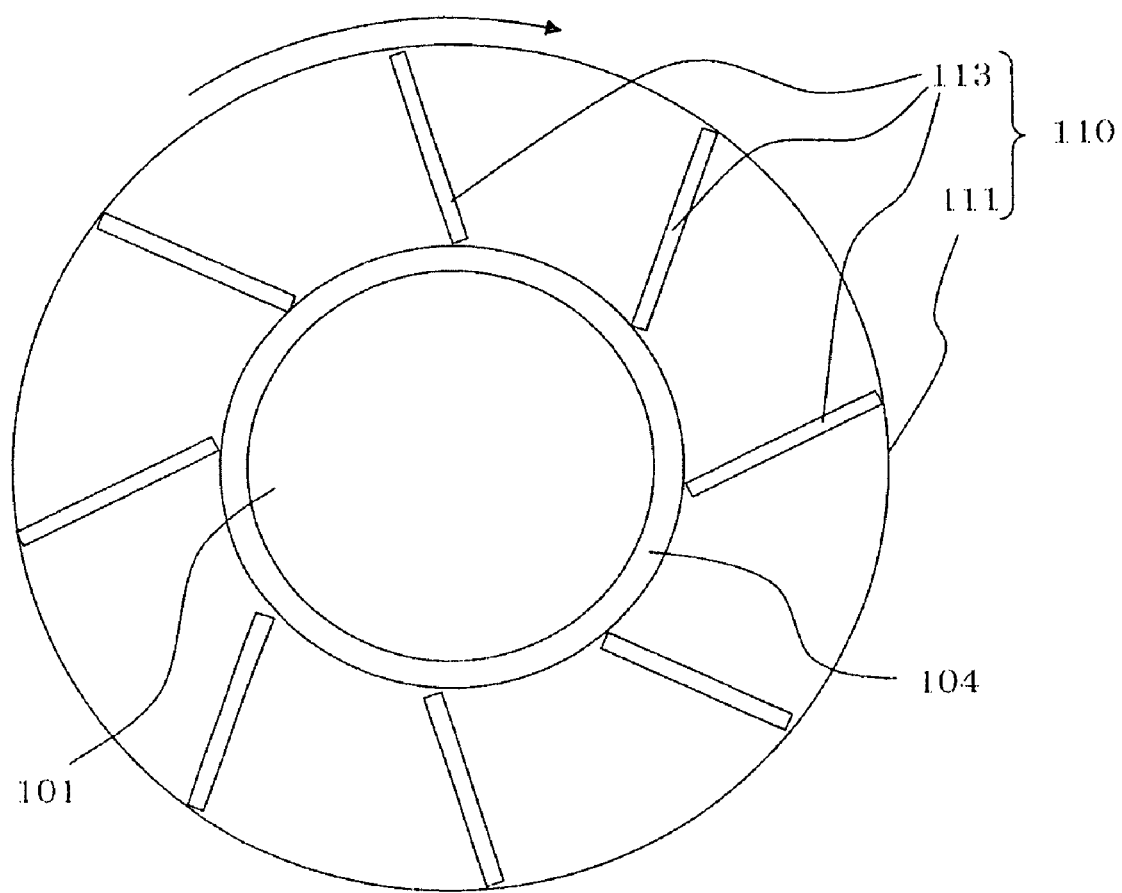
FIG. 4 is a conceptual diagram showing another example of a shape of the bladed wheel according to the first embodiment of the present invention.

As examples of the plurality of blades 112 fixed to the bladed wheel 110 according to the first embodiment, in FIG. 3, streamlined blades 112 each having a smoothly curved surface are given. However, as shown in FIG. 4, flat-plate-shaped blades 113 may be arranged. As long as the raw gas above the wafer 101 is discharged on an almost outer side with respect to the center of the wafer 101, the shapes of the blades 112 are not limited to specific shapes.

In FIGS. 3 and 4, although the eight blades 112 are fixed to the bladed wheel 110, the number of the blades 112 is not limited. Furthermore, when fixing angles of the blades 112 are changed, the raw gas can be discharged on an almost outer side with respect to the center of the wafer 101 by rotating the bladed wheel 110 in an appropriate direction including a direction different from the direction of the arrow shown in FIGS. 3 and 4.

Figure 5:
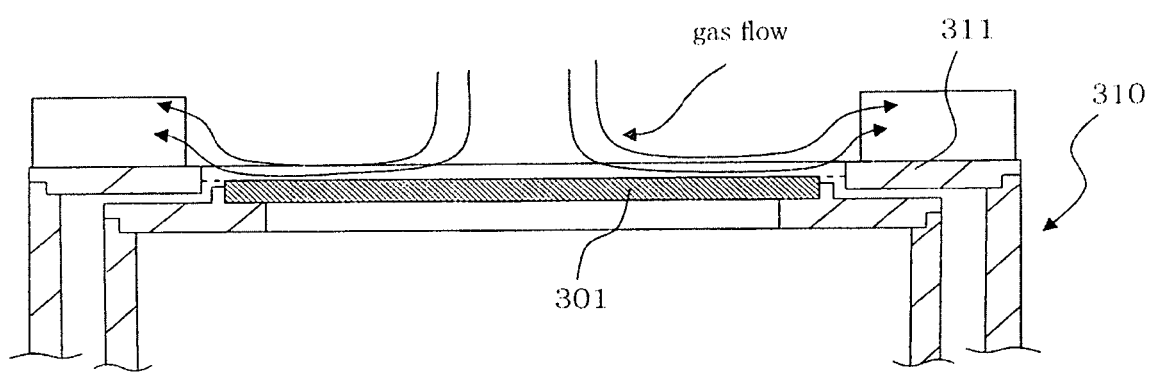
FIG. 5 is a conceptual diagram showing a bladed wheel the base plate of which is higher than a position of an upper surface of the wafer.

FIG. 5 is a conceptual diagram showing a bladed wheel 310 arranged at a position higher than an upper surface of a wafer 301.

When the base plate 311 of the bladed wheel 310 is set at a position higher than the wafer 301, a flow of a raw gas from a supply passage is brought into contact with the surface of the wafer 301 to change the flowing direction into an almost horizontal direction. The raw gas tends to flow to a exhaust passage connected to a vacuum pump (not shown) while performing epitaxial growth. However, the position of the base plate 311 of the bladed wheel 310 is higher than the upper surface of the wafer 301. For this reason, the flow of the raw gas is blocked by the inner side surface of the bladed wheel 310. More specifically, even though the bladed wheel 310 is rotated to form a laminar flow of the raw gas, turbulence occurs. As a result, the raw gas above the wafer 301 cannot be rapidly discharged. A new raw gas cannot be brought into contact with the surface of the wafer 301 not to advance a growth rate of an epitaxial growth film. Furthermore, since the raw gas above the wafer 301 becomes turbulent, in-plane uniformity of the epitaxial growth film grown on the wafer 301 is also deteriorated.

Therefore, a positional relationship of the wafer 301 and the bladed wheel 310 is not preferable.

Figure 6:
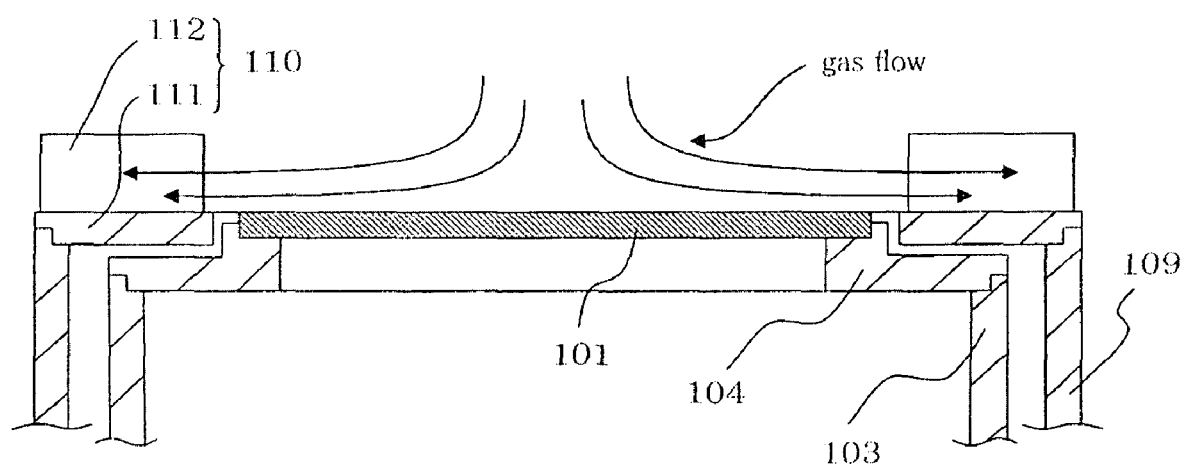
FIG. 6 is a conceptual diagram showing positions of the bladed wheel and the wafer according to the first embodiment.

FIG. 6 is a conceptual diagram showing positions of the bladed wheel 110 and the wafer 101 according to the first embodiment. In the first embodiment, the level of the base plate 111 of the bladed wheel 110 has a level almost equal to that of the upper surface of the wafer 101.

When the bladed wheel 110 is used, the flow of the raw gas cannot be blocked. Therefore, a laminar flow of the raw gas can be formed above the wafer 101. Therefore, epitaxial growth is performed with a uniform film thickness on the whole surface of the wafer 101.

FIG. 6 shows a case in which the level of the position of the upper surface of the wafer 101 is equal to the level of the position of the base plate 111. However, even though the level of the base plate 111 of the bladed wheel 110 is lower than the level of the upper surface of the wafer 101, the flow of the raw gas is not blocked, as a matter of course.

As described above, when the position of the base plate 111 of the bladed wheel 110 is set to be equal to or lower than the position of the upper surface of the wafer 101, the bladed wheel 110 can sufficiently bring out the function.

Figure 7:
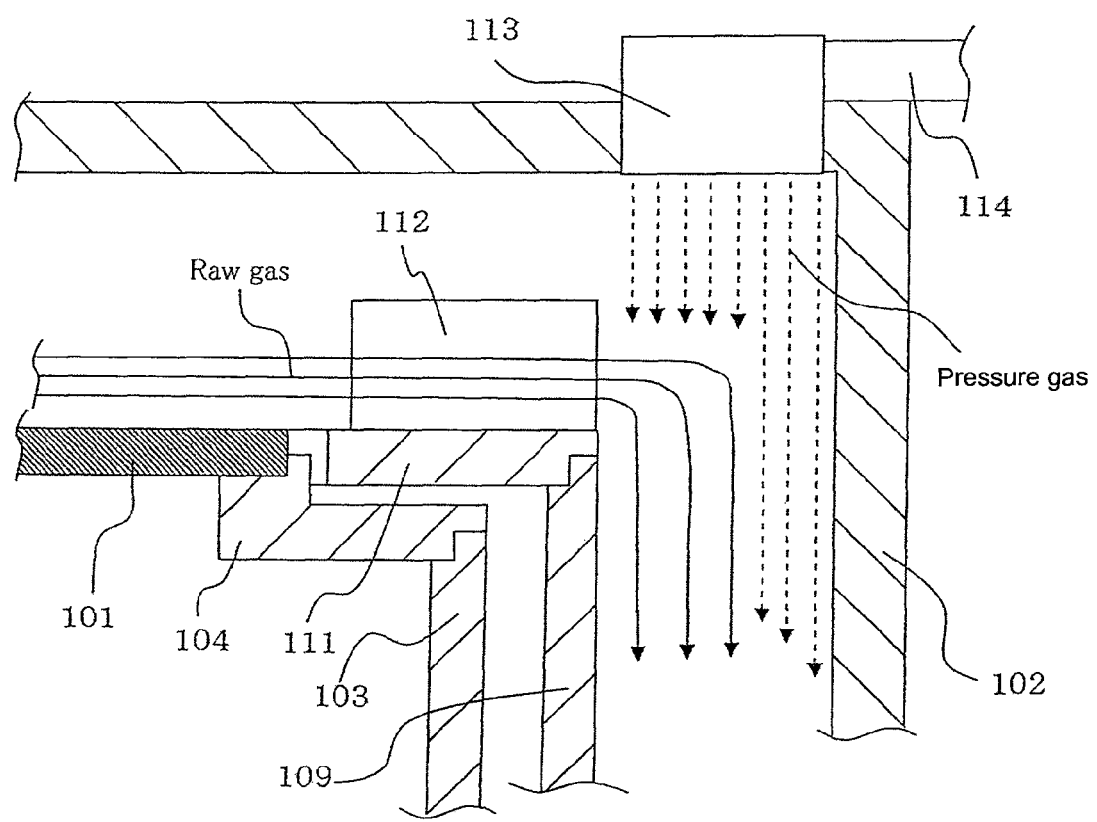
FIG. 7 is a conceptual diagram showing a shower plate arranged in the chamber and a flow of a raw gas in the chamber.

FIG. 7 is a conceptual diagram showing the shower plate 113 arranged in the chamber 102 and the flow of a raw gas in the chamber 102.

With rotation of the bladed wheel 110, when the raw gas almost horizontally discharged from above the wafer 101 after epitaxial growth directly goes straight, the raw gas is brought into contact with the inner surface of the outer wall of the chamber 102. At this time, the raw gas after the epitaxial growth reaction becomes turbulent, and does not smoothly get exhausted from the chamber 102. In order to prevent this, the shower plate 113 is arranged on the chamber 102 to blow a pressure gas such as hydrogen ($H_2$) toward the exhaust passage 108. The pressure gas almost downwardly rectifies the almost horizontally flowing raw gas after the epitaxial growth reaction. For this reason, the flow of the raw gas is not brought into contact with the inner surface of the outer wall of the chamber 102 while being almost horizontally kept with respect to the wafer 101. Therefore, the raw gas is not turbulent in the chamber 102, and the raw gas can be smoothly exhaust out of the chamber 102. More specifically, a smooth flow of the raw gas flowing from the supply passage 107 to the exhaust passage 108 through above the wafer 101 is formed.

As a result, a growth rate of an epitaxial growth film grown on the surface of the wafer 101 and in-plane uniformity of the film thickness of the epitaxial growth film can be advanced.

As a gas used as the pressure gas, $H_2$ is given as an example. However, any gas which does not disturb an atmosphere in which epitaxial growth is performed in the chamber 102 can be used. The type of the gas is not limited.

Second Embodiment

An epitaxial growth apparatus of an aspect which uses a scheme of heating a wafer by different heating methods will be described below.

Figure 8:
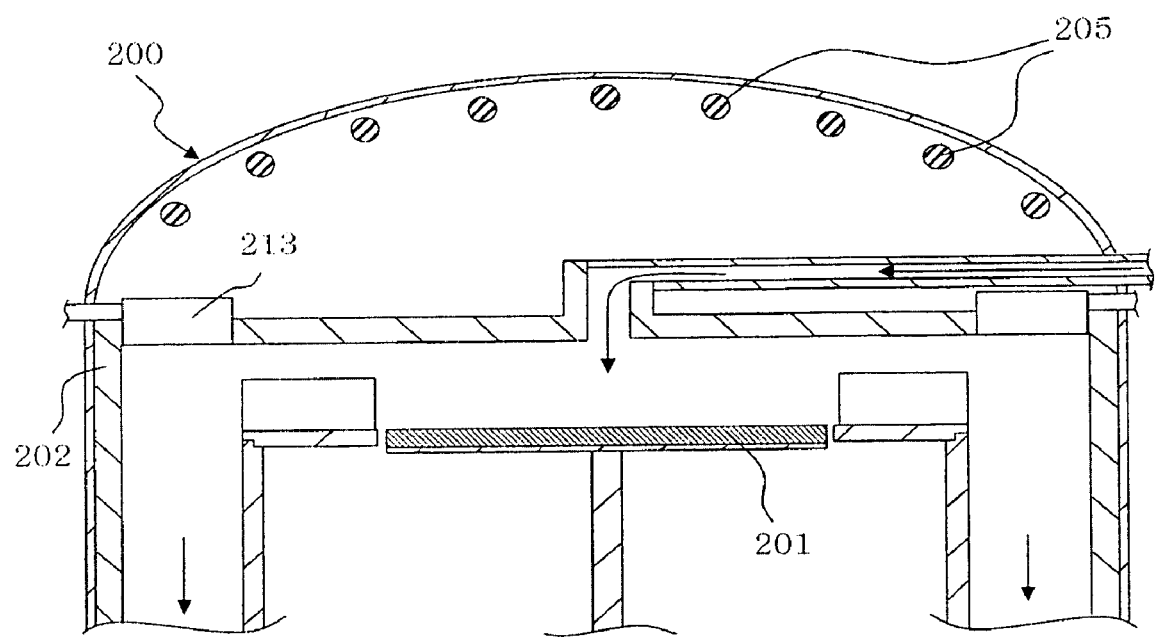
FIG. 8 is a conceptual diagram showing an epitaxial growth apparatus according to a second embodiment.
Figure 9:
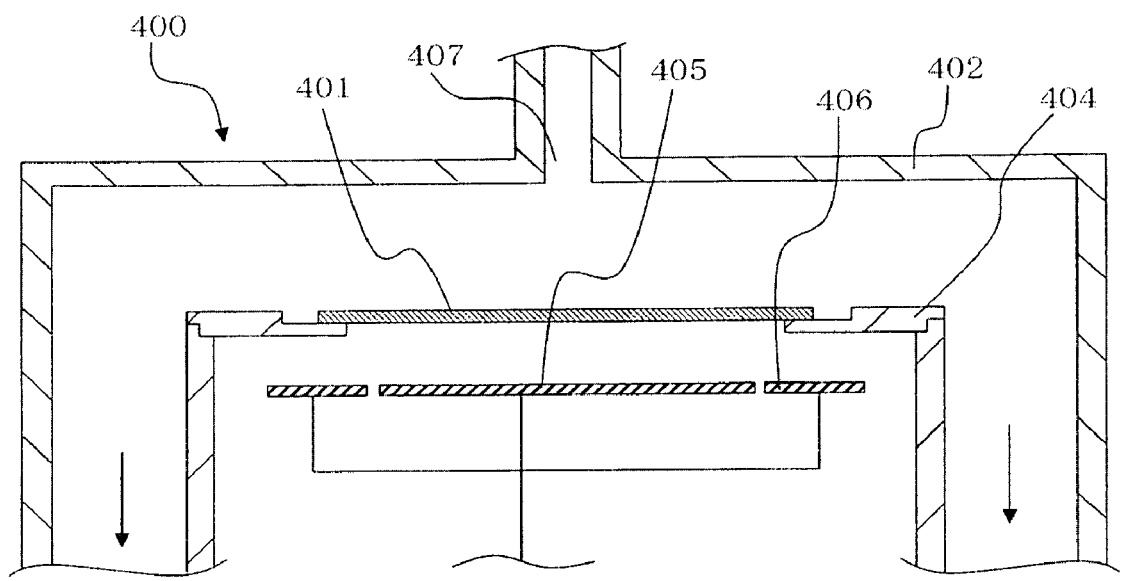
FIG. 9 is a conceptual diagram showing a configuration of a conventional vapor phase deposition apparatus.

FIG. 8 is a conceptual diagram showing an epitaxial growth apparatus according to the embodiment.

In this epitaxial growth apparatus 200, a lamp heater 205 is arranged on the outside of a chamber 202. An environment in the chamber 202 is created to make it possible to perform epitaxial growth, and the wafer 201 is heated by the lamp heater 205 to grow an epitaxial growth film on the surface of the wafer 201.

In the epitaxial growth apparatus 200 according to the embodiment, as in the epitaxial growth apparatus 100 according to the first embodiment, the raw gas in the chamber 202 can be smoothly discharged by rotating the bladed wheel 210. In this manner, a growth rate of the epitaxial growth film grown on the surface of the wafer 201 is advanced.

As described above, not only the resistance heating shown in FIG. 1, but also the lamp heater 205 or other heating methods may be used.

As in the explanation based on FIGS. 1 to 7, a flow of the raw gas in the chamber 202 is made laminar is by the rotation of the bladed wheel 210, the raw gas is further rectified and smoothly exhausted out of the chamber 202 by arranging a shower plate 213, and other members are arranged. For this reason, a description of these members is same as the description based on FIGS. 1 to 7.

The embodiments have been described above with reference to the concrete example. The present invention is not limited to the embodiments described above. Various changes of the invention can be effected without departing from the spirit and scope of the invention.

For example, the rotation directions of the holder 104 and the bladed wheel 110 may be the same directions or opposite directions. A raw gas after epitaxial growth may be rapidly discharged from above the wafer 101, and the holder 104 and the bladed wheel 110 need not have the same rotation directions.

In the present invention, an epitaxial growth apparatus is described as an example of a vapor phase deposition apparatus. However, the present invention is not limited to the epitaxial growth apparatus, and an apparatus to vapor phase deposit a predetermined crystal film on a wafer surface may be used.

For example, an apparatus to grow a polysilicon film may be used.

A configuration, a control method, and the like which are not directly necessary for the present invention in the apparatus are omitted. However, a necessary configuration and a necessary control method of the apparatus can be arbitrary selected and used.

All vapor phase deposition apparatuses which include the elements of the present invention and can be arbitrarily changed in design by a person skilled in the art and shapes of the members of the vapor phase deposition apparatus are included in the spirit and scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vapor phase deposition apparatus comprising:
   a chamber;
   a supply unit configured to supply a raw gas into the chamber;
   a support table disposed in the chamber and configured to support a substrate in the chamber;
   a rotatable bladed wheel surrounding the support table and configured to rotate around the support table, the wheel comprising a plurality of blades constructed and arranged such that the rotating of the blades during a deposition operation drives a flow of raw gas from the supply unit over the support table, wherein the wheel rotates at a higher rotation speed than a rotation speed of the support table; and
   an exhaust unit configured to exhaust the raw gas after a vapor phase deposition reaction from the chamber.

2. The vapor phase deposition apparatus according to claim 1, wherein a base plate of the bladed wheel on which the plurality of blades are fixed is formed at a position equal to or lower than a level of the substrate supported by the support table.

3. The vapor phase deposition apparatus according to claim 1, wherein a shower plate configured to blow a pressure gas for rectifying the raw gas is arranged in the chamber.

4. The vapor phase deposition apparatus according to claim 1, wherein a recessed portion having a depth which is smaller than a thickness of the substrate and an inner diameter which is larger than a diameter of the substrate is formed in the support table.

5. The vapor phase deposition apparatus according to claim 1, wherein the plurality of blades are formed to have streamlined curved surfaces, respectively.

6. The vapor phase deposition apparatus according to claim 5, wherein the plurality of blades are fixed at predetermined angles with respect to a radial direction of the bladed wheel.

7. The vapor phase deposition apparatus according to claim 1, wherein the plurality of blades are formed to have flat-plate shapes, respectively.

8. The vapor phase deposition apparatus according to claim 7, wherein the plurality of blades are fixed at predetermined angles with respect to the radial direction of the bladed wheel.

* * * * *